(12) United States Patent
Durham et al.

(10) Patent No.: US 10,879,901 B2
(45) Date of Patent: Dec. 29, 2020

(54) DUAL RAIL CIRCUITRY USING FET PAIRS

(71) Applicant: Hewlett-Packard Development Company, L.P., Houston, TX (US)

(72) Inventors: Michael R Durham, Houston, TX (US); Robert C Brooks, Houston, TX (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/097,823

(22) PCT Filed: Jul. 17, 2016

(86) PCT No.: PCT/US2016/042691
§ 371 (c)(1),
(2) Date: Oct. 30, 2018

(87) PCT Pub. No.: WO2018/017035
PCT Pub. Date: Jan. 25, 2018

(65) Prior Publication Data
US 2019/0140646 A1   May 9, 2019

(51) Int. Cl.
*H03K 19/094* (2006.01)
*H03K 17/687* (2006.01)
(Continued)

(52) U.S. Cl.
CPC ......... *H03K 19/094* (2013.01); *H03K 17/102* (2013.01); *H03K 17/302* (2013.01);
(Continued)

(58) Field of Classification Search
None
See application file for complete search history.

(56) References Cited

U.S. PATENT DOCUMENTS 4,318,040 A * 3/1982 Hilbourne ................. G05F 1/56
323/312
4,645,954 A   2/1987 Schuster
(Continued)

FOREIGN PATENT DOCUMENTS

EP    0736828 A2   3/1996
TW    200818671 A   4/2008
(Continued)

OTHER PUBLICATIONS

Adam, Using MOSFETs as General Switches, <http://www.electronic-products-design.com/geek-area/electronics/mosfets/using-mosfets-as-general-switches date: Apr. 2016.
(Continued)

*Primary Examiner* — Crystal L Hammond
(74) *Attorney, Agent, or Firm* — Brooks Cameron & Huebsch PLLC (US LC)—USD

(57) ABSTRACT

Example implementations relate to dual rail circuitry using FET pairs. For example, a circuit according to the present disclosure may include a first field-effect transistor (FET) pair coupled to a dual rail circuitry, a second FET pair coupled to the dual rail circuitry, and a controller coupled to the first FET pair and the second FET pair. The controller may switch a power supply to the dual rail circuitry using the first FET pair and the second FET pair. The dual rail circuitry may provide a power supply to a computing device from a first power supply coupled to the first FET pair or a second power supply coupled to the second FET pair.

15 Claims, 3 Drawing Sheets

(51) Int. Cl.
*H03K 17/693* (2006.01)
*H03K 17/10* (2006.01)
*H03K 17/30* (2006.01)

(52) U.S. Cl.
CPC ....... *H03K 17/6874* (2013.01); *H03K 17/693* (2013.01); *H03K 2017/307* (2013.01); *H03K 2217/0036* (2013.01)

(56) References Cited

U.S. PATENT DOCUMENTS

| | | | |
|---|---|---|---|
| 6,377,032 B1* | 4/2002 | Andruzzi | H02M 3/1588 323/224 |
| 6,578,152 B1* | 6/2003 | Burnside | G06F 1/263 326/34 |
| 6,724,588 B1 | 4/2004 | Cummings et al. | |
| 6,892,147 B2 | 5/2005 | Bui et al. | |
| 7,254,002 B2* | 8/2007 | Aemireddy | G05F 3/262 307/51 |
| 7,432,687 B2* | 10/2008 | Jacobs | H02M 3/3376 323/222 |
| 2002/0036486 A1* | 3/2002 | Zhou | G05F 1/62 323/272 |
| 2002/0080663 A1* | 6/2002 | Kameyama | H03K 19/0016 365/200 |
| 2004/0089645 A1* | 5/2004 | Saccon | B23K 9/091 219/130.21 |
| 2004/0095117 A1* | 5/2004 | Kernahan | H02M 3/157 323/282 |
| 2004/0100807 A1* | 5/2004 | MacDonald | G06F 1/263 363/142 |
| 2004/0119448 A1* | 6/2004 | Wiegand | G05F 1/613 323/223 |
| 2005/0037241 A1 | 2/2005 | Schneider et al. | |
| 2006/0119329 A1* | 6/2006 | Jacobs | H02M 3/3376 323/234 |
| 2006/0132111 A1* | 6/2006 | Jacobs | G05F 1/618 323/282 |
| 2006/0152084 A1 | 7/2006 | Tupman | |
| 2006/0152085 A1* | 7/2006 | Flett | B60L 9/30 307/75 |
| 2007/0019442 A1* | 1/2007 | Li | H02J 1/08 363/15 |
| 2014/0042813 A1 | 2/2014 | Zilberberg et al. | |
| 2014/0103894 A1* | 4/2014 | McJimsey | G05F 1/67 323/282 |
| 2014/0152351 A1 | 6/2014 | Brumett, Jr. et al. | |
| 2015/0002124 A1* | 1/2015 | Kinoshita | H02M 3/158 323/285 |
| 2016/0152084 A1* | 6/2016 | Murata | B60C 11/1236 152/209.8 |
| 2016/0161972 A1* | 6/2016 | Tan | G05F 3/262 323/312 |
| 2016/0187904 A1* | 6/2016 | Merkin | G05F 1/575 323/280 |

FOREIGN PATENT DOCUMENTS

| | | |
|---|---|---|
| TW | M388782 U1 | 9/2009 |
| WO | WO-2010030782 | 3/2010 |

OTHER PUBLICATIONS

Stephen Evanczuk, Power-Source Selection in Energy-Harvesting Designs, Feb. 16, 2016, <https://www.digikey.com/en/articles/power-source-selection-in-energy-harvesting-designs.
TPS241x N+1 and ORing Power Rail Controller, Jan. 2007, http://www.ti.com/lit/ds/symlink/tps2412.pdf.

* cited by examiner

DUAL RAIL CIRCUITRY USING FET PAIRS

BACKGROUND

A computing device may include a plurality of universal serial bus (USB) ports for connection, communication, and power supply between the computing device and electronic devices. Electronic devices coupled to the computing device via a USB port may not only transmit information to and from the computing device, but may share a power supply with the computing device and therefore impact the power usage of the computing device.

DETAILED DESCRIPTION

Figure 1:
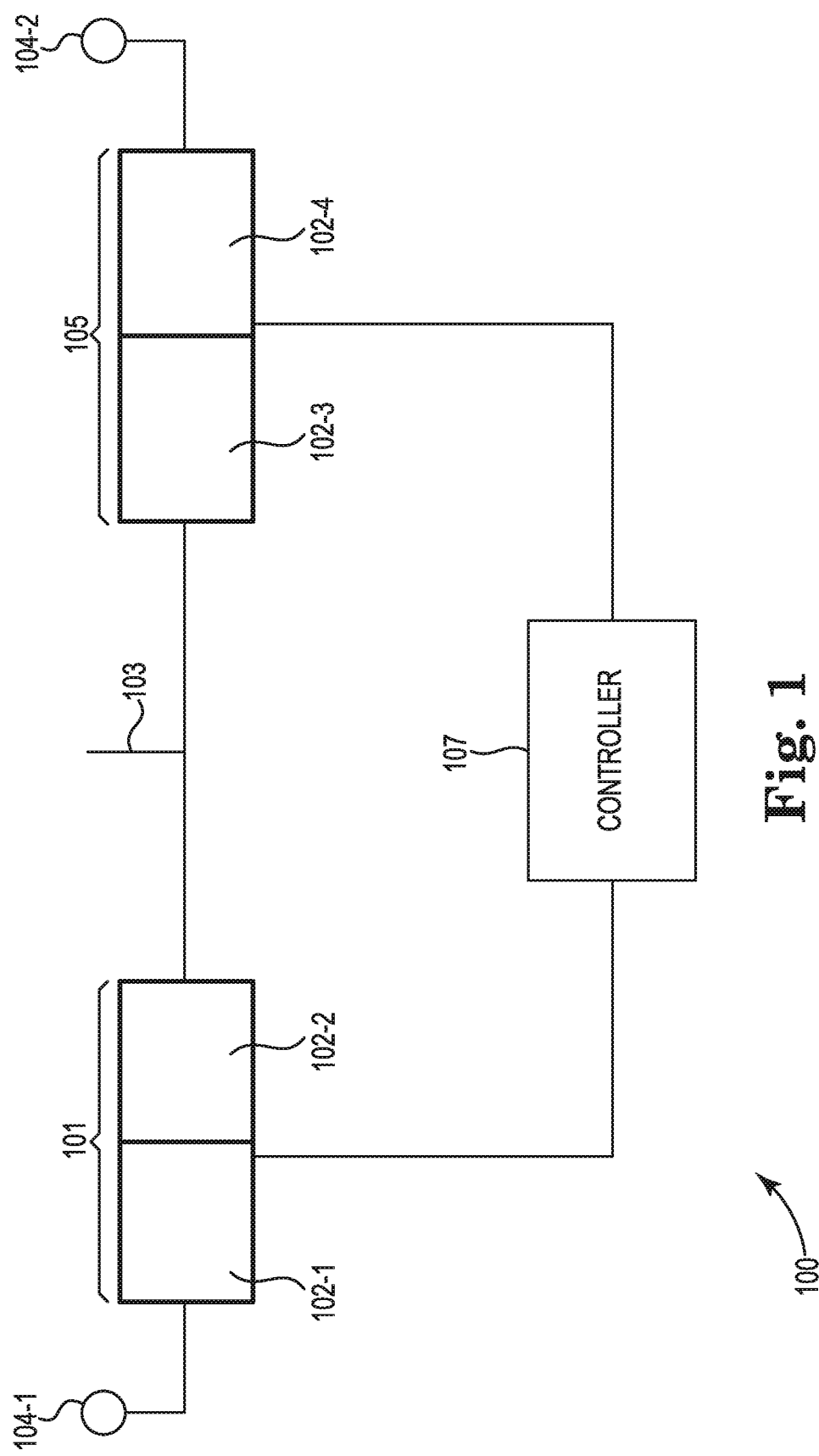
FIG. 1 illustrates a diagram of an example circuit for dual rail circuitry using field effect transistor (FET) pairs, according to the present disclosure.

A computing device may be powered by multiple power supplies. Such computing devices may include dual rail circuitry. As used herein, a dual rail circuit refers to a single power output coupled to multiple power supplies. A dual rail circuit that is coupled to multiple power supplies may require coordination when switching from one power supply to another. Moreover, dual rail circuits may have higher currents and a higher sensitivity to a drop in voltage as opposed to single rail circuits. Furthermore, an efficient power supply may be selected to power the computing device. Power consumed by a component may be measured by the voltage drop across the component, and multiplied by the current through it. As such, an "efficient" power path, as used herein, refers to a power path with the least amount of power loss. That is, an efficient power path refers to a power path that dissipates less power than other power paths, that results in less power loss as compared to other power paths, and minimizes a voltage drop across the voltage path.

External circuits may be used to monitor voltages across a dual rail, and to coordinate switching from one power supply to another. However, FET dual rail circuits may be difficult to use, particularly when switching from one power supply to another power supply. In such circuits, the manufacturer may have to decide to implement a break-before-make circuit or a make-before-break circuit to control the power supply without lowering the voltage across the dual rail. As used herein, a break-before-make circuit refers to a switch that is configured to break a first set of contacts before engaging (e.g., making) a new set of contacts. Similarly, a make-before-break circuit refers to a switch that is configured to establish (e.g., make) a new connection path before previous connection paths are broken. Both types of circuits may decrease performance.

For instance, when a make-before-break circuit is used, a shoot-through current may occur and damage the dual rail FETs. As used herein, a shoot-through current refers to a rush of current that occurs while both power supplies are powering the dual rail circuit. Similarly, if a break-before-make circuit is used, then the dual rail voltage may drop to levels such that the system powered by the dual rail may malfunction and/or suffer a decrease in performance. In other examples, the manufacturer may use a diode-OR circuit which allows both power supplies to power to the dual rail, but the diodes may utilize too much power in high current applications.

Moreover, computing devices are increasingly being designed with USB type-C capability, which provides power delivery to USB type-C devices and/or receiving power from USB type-C devices. When a computing device receives power from a USB type-C device, and also receives power from an adapter or other power supply, then a dual rail circuit may be used to combine power or supply power from one of the available sources. The available power supplies may not be known to the computing device ahead of time, and must be managed as the power supplies become available. As discussed above, managing a dual rail circuit may be challenging, especially switching between power supplies as the supplies become available.

In contrast, dual rail circuitry using FET pairs, in accordance with the present disclosure, may manage switching between power supplies in a dual rail circuit. Each FET pair may provide the benefits of a body diode in a FET of the FET pair is turned off, and dissipate less power when a FET of the FET pair is turned ON. That is, dual rail circuitry using FET pairs, as described herein, provides benefits of both the body diode in the FET and the FET in a single component, and provides for optimal switching between multiple power supplies with minimal loss of power. The dual rail circuitry using FET pairs, as described herein, may select an efficient power path, and switch to the efficient power path using the FET pairs. By controlling the FETs independently and by using FET pairs, the dual rail voltage may be maintained without the need for a break-before-make or make-before-break circuit.

FIG. 1 illustrates a diagram of an example circuit 100 for dual rail circuitry using FET pairs, according to the present disclosure. As illustrated in FIG. 1, the circuit 100 may include a first FET pair 101 coupled to a dual rail circuitry 103. Similarly, the circuit 100 may include a second FET pair 105 coupled to the dual rail circuitry 103. Collectively, the first FET pair 101 and the second FET pair 105 may form a diode OR dual rail circuitry via the FET body diode.

As illustrated in FIG. 1, each FET pair (e.g., 101 and 105) may include a plurality of components. For example, FET pair 101 may include two FETs, 102-1 and 102-2, arranged in series. FET pair 105 may include two FETs, 102-3 and 102-4, arranged in series. As used herein, a FET, or field-effect-transistor, refers to a transistor that uses an electric field to control the shape and electrical conductivity of a channel in a semiconductor material. Each FET within a FET pair, such as FET pair 101, includes a body diode. Each body diode in a FET pair may be disposed in opposite directions such that a current flow may be blocked when neither FET is on. The body diode in 102-2 can only conduct when the FET 102-1 is on.

As illustrated in FIG. 1, the FET 102-2 of FET pair 101 and FET 102-3 may be proximal to an output of the dual rail circuitry 103, relative to FET 102-1 of FET pair 101 and FET 102-4 of FET pair 105. As such, FET 102-1 of FET pair 101 and FET 102-4 may be distal to the output of the dual rail circuitry 103, relative to FET 102-2 of FET pair 101 and FET 102-3 of FET pair 105.

Circuit 100 may include a controller 107 coupled to the first FET pair 101 and the second FET pair 105, As used herein, a "controller" refers to a component in circuit 100 comprising hardware and instructions to control another portion of circuit 100. The controller 107 may perform a number of operations, including switching a power supply to the dual rail circuitry 103 using the first FET pair 101 and the second FET pair 105.

The controller 107 may maintain a current to the dual rail circuitry 103 during the switch of the power supply, as described herein. That is, the controller 107 may maintain a current to the dual rail circuitry 103 when switching between a first power supply, 104-1, and a second power supply 104-2. For example, the controller 107 may detect a first power supply 104-1 is coupled to the dual rail circuitry 103. The controller 107 may detect that a new power supply is coupled to the dual rail circuitry, such as second power supply 104-2. That is, controller 107 may detect that the first power supply 104-1 and the second power supply 104-2 are coupled to the dual rail circuitry 103. The controller 107 may further identify whether the power path associated with the first power supply 104-1 or the power path associated with second power supply 104-2 minimizes a voltage drop across the dual rail circuitry 103, e.g., if the first power supply 104-1 or the second power supply 104-2 is more efficient. The controller 107 may then switch the power supply to the dual rail circuitry 103, based on the identification of the power supply that minimizes the voltage drop, e.g., the efficient power path.

In some examples, the circuit 100 may include a computing device (not illustrated in FIG. 1), coupled to the dual rail circuitry 103. In such examples, the dual rail circuitry 103 may provide a power supply to the computing device from a first power supply 104-1 coupled to the first FET pair 101 or a second power supply 104-2 coupled to the second FET pair 105.

As described herein, each of the FETs (102-1, 102-2, 102-3, and 102-4) may be individually actuated as a power supply is switched. For instance, controller 107 may send a signal to turn off FET 102-3, while FET 102-4 remains on, such that controller 107 may switch from power supply 104-2 to power supply 104-1. Similarly, controller 107 may send a signal to turn on FET 102-1, while FET 102-2 remains off. Subsequently, controller 107 may turn on FET 102-2 and turn off FET 102-4. FET 102-2 may be turned on and FET 102-4 may be turned off substantially simultaneously, such that the voltage drop to the dual rail circuitry is minimized. In other examples, FET 102-2 may be turned on and FET 102-4 may be turned off at separate times, though within a defined period of time.

Although examples are provided for switching from power supply 104-2 to power supply 104-1, illustrated in FIG. 1, examples are not so limited. The reverse may also apply, such that power supply is switched from 104-1 to 104-2, illustrated in FIG. 1. In such examples, FET 102-1 and FET 102-2 may be on, as power supply 104-1 supplies dual rail circuitry 103. FET 102-3 and 102-4 may be off. The controller 107 may instruct FET 102-2 to turn off, and FET 102-4 to turn on. Subsequently, the controller 107 may instruct FET 102-1 to turn off, and FET 102-3 to turn on. As described herein, FET 102-1 may turn off, and FET 102-3 may turn on substantially simultaneously.

Figure 2:
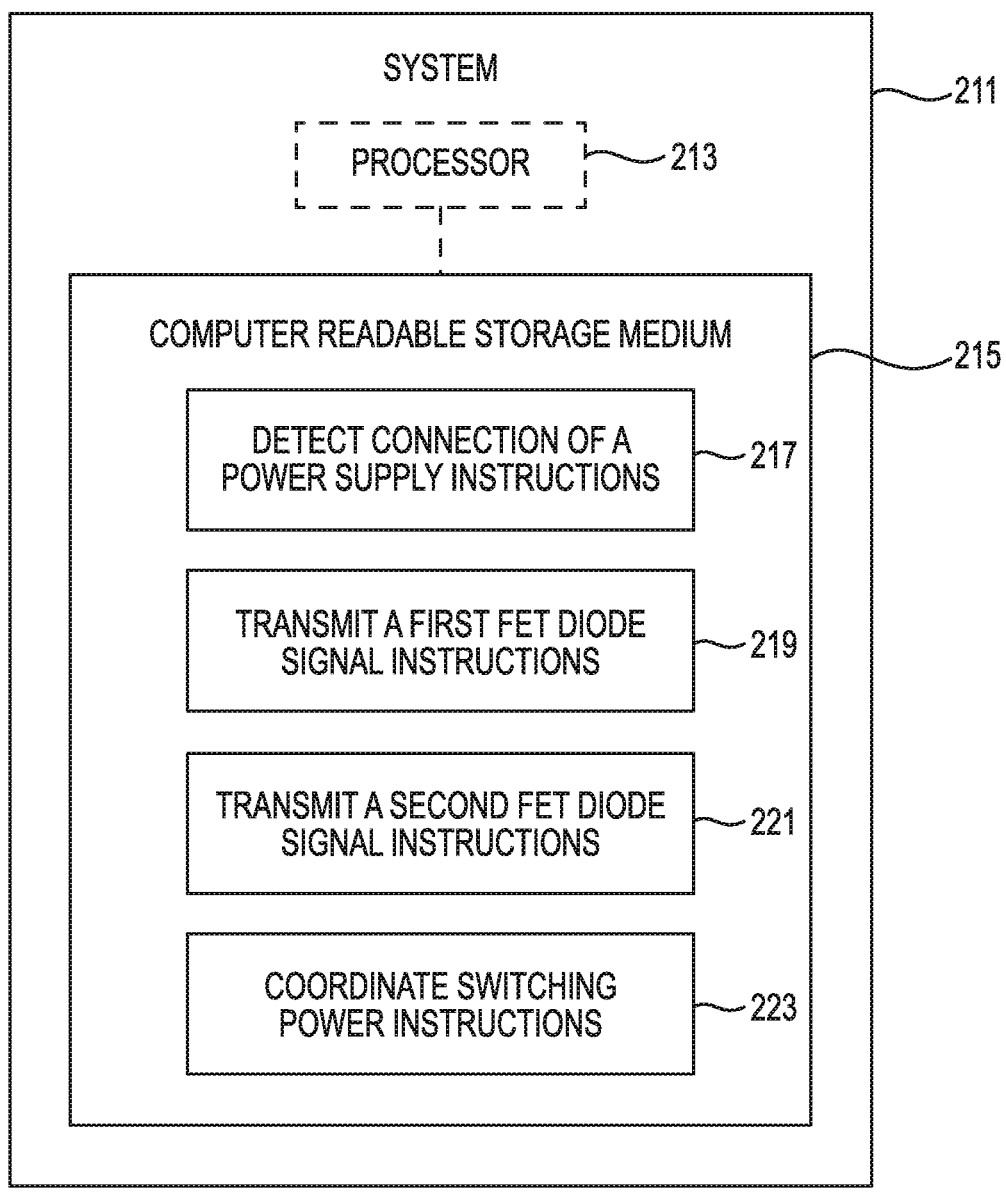
FIG. 2 is a block diagram of an example system for dual rail circuitry using FET pairs, according to the present disclosure according to the present disclosure.

FIG. 2 is a block diagram of an example system 211 for dual rail circuitry using FET pairs, according to the present disclosure. System 211 may include at least one computing device that is capable of communicating with at least one remote system. In the example of FIG. 2, system 211 includes a processor 213 and a computer-readable storage medium 215. Although the following descriptions refer to a single processor and a single computer-readable storage medium, the descriptions may also apply to a system with multiple processors and multiple computer-readable storage mediums. In such examples, the instructions may be distributed (e.g., stored) across multiple computer-readable storage mediums and the instructions may be distributed (e.g., executed by) across multiple processors.

Processor 213 may be a central processing unit (CPU), a semiconductor based microprocessor, and/or other hardware devices suitable for retrieval and execution of instructions stored in computer-readable storage medium 215. Processor 213 may fetch, decode, and execute instructions 217, 219, 221, 223, or a combination thereof. As an alternative or in addition to retrieving and executing instructions, processor 213 may include at least one electronic circuit that includes electronic components for performing the functionality of instructions 217, 219, 221, 223 or a combination thereof.

Computer-readable storage medium 215 may be any electronic, magnetic, optical, or other physical storage device that stores executable instructions. Thus, computer-readable storage medium 215 may be, for example, Random Access Memory (RAM), an Electrically-Erasable Programmable Read-Only Memory (EEPROM), a storage drive, an optical disc, etc. In some examples, computer-readable storage medium 215 may be a non-transitory storage medium, where the term "non-transitory" does not encompass transitory propagating signals. Computer-readable storage medium 215 may be encoded with a series of processor executable instructions 217, 219, 221, and 223.

Referring to FIG. 2, the detect connection of a power supply instructions 217, when executed by a processor (e.g., 212), may cause system 211 to detect connection of a second power supply to second power supply circuitry. Referring to FIG. 1, second power supply circuitry may refer to circuitry coupling power supply 104-2 to dual rail circuitry 103. Similarly, first power supply circuitry may refer to circuitry coupling power supply 104-1 to dual rail circuitry 103. As such, system 211 may detect that a new power supply, such as power supply 104-1 illustrated in FIG. 1, is coupled to the dual rail circuitry, such as dual rail circuitry 103 illustrated in FIG. 1. Put another way, system 211 may detect that a power supply other than the existing power supply is available for powering the dual rail circuitry.

Transmit a first FET pair signal instructions 219, when executed by a processor (e.g., 213), may cause system 211 transmit a first signal to a FET pair of a first power supply circuitry coupled to a first power supply. As described in relation to FIG. 1, the first supply circuitry and the second supply circuitry may form a dual rail circuitry. The signal transmitted to the FET pair of the first power supply may instruct the FET to turn on or off. For instance, the instructions to transmit the first signal to the FET pair of the first power supply circuitry may include instructions to turn off a FET on the FET pair of the first power supply circuitry in response to receipt of the first signal. Referring to FIG. 1, instructions 219 may instruct controller 107 to send a signal to turn off FET 102-3, such that controller 107 may switch from power supply 104-2 to power supply 104-1.

The transmit a second FET pair signal instructions 221, when executed by a processor (e.g., 213), may cause system 211 to transmit a second signal to a FET pair of the second power supply circuitry. That is, instructions 221 to transmit the second signal to the FET pair of the second power supply circuitry may include instructions to turn on a FET on the FET pair of the second power supply circuitry in response to receipt of the second signal. Again, referring to FIG. 1, instructions 221 may instruct controller 107 to send a signal to turn on FET 102-1, such that controller 107 may switch from power supply 104-2 to power supply 104-1.

The coordinate switching power instructions 223, when executed by a processor (e.g., 213), may cause system 211 to coordinate switching power supplied to the dual rail circuitry from the first power supply to the second power supply, in response to the transmission of the first signal and the second signal. Instructions 223 to coordinate switching power supplied to the dual rail circuitry may include instructions to turn on a FET on the FET pair of the second power supply circuitry, and turn off a FET on the FET pair of the first power supply circuitry substantially simultaneously. That is, referring to FIG. 1, instructions 223 may instruct controller 107 to turn on FET 102-2 and turn off FET 102-4.

In some examples, the system 211 may include instructions that, when executed by a processor (e.g., 213), may cause system 211 to identify if the first power supply or the second power supply results in a lower amount of power loss by the dual rail circuitry. That is, the system 211 may identify which of a plurality of power supplies is a more efficient power supply.

Figure 3:
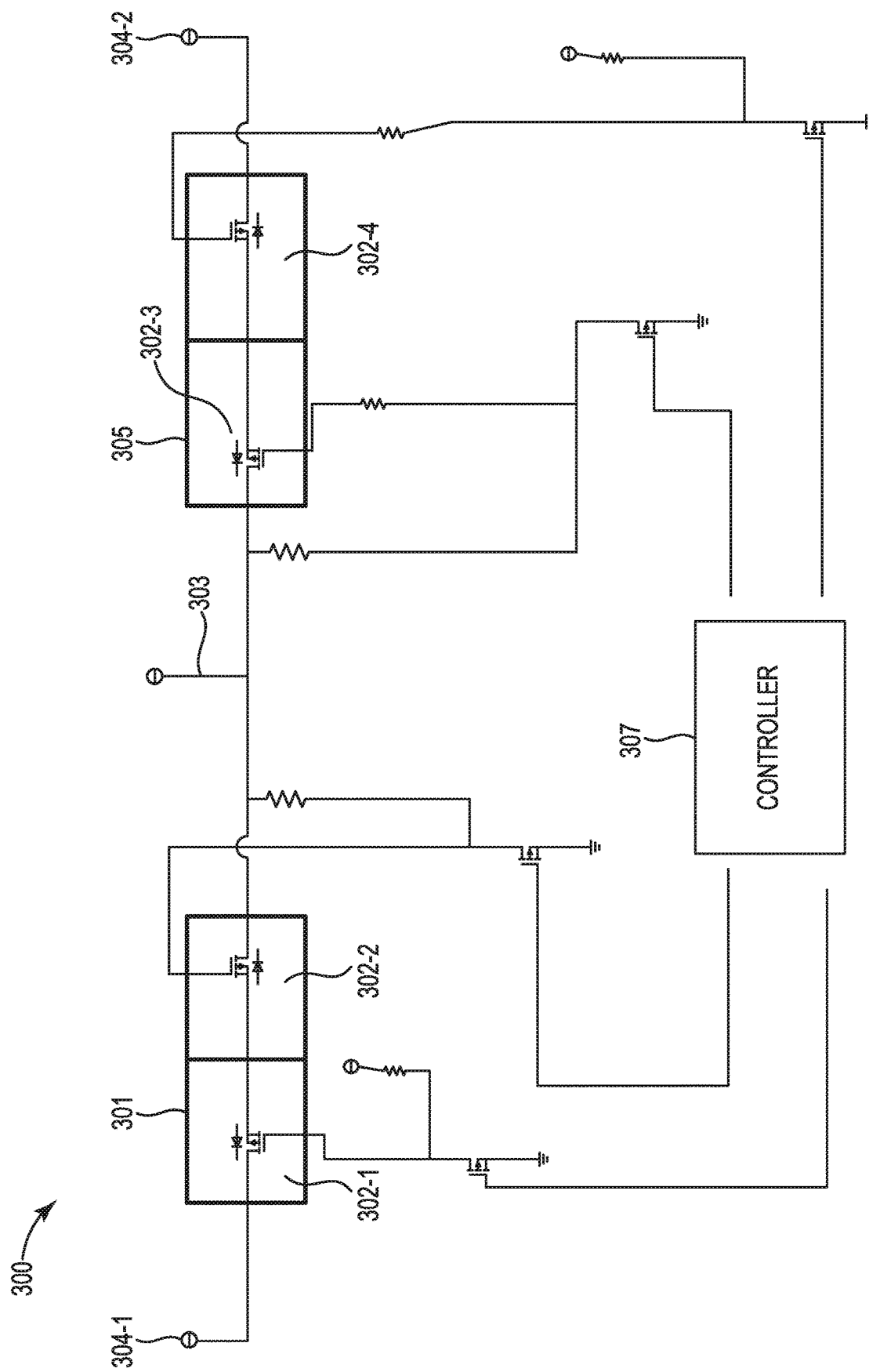
FIG. 3 illustrates an example method for dual rail circuitry using FET pairs, according to the present disclosure.

FIG. 3 illustrates an example circuit 300, according to the present disclosure. As discussed in relation to FIG. 1, the circuit 300 may include a first FET pair 301 and a second FET pair 305. Each FET pair may be coupled to the dual rail circuitry 303. Furthermore, the dual rail circuitry 303, via FET pairs 301 and 305, may be coupled to the controller 307. As discussed in relation to FIG. 1, the controller 307 may detect that a power supply is coupled to a dual rail circuitry 303. For instance, controller 307 may detect that power supply 304-2 is powering the dual rail circuitry 303.

Furthermore, the controller 307 may detect that a new power supply is coupled to the dual rail circuitry 303. As used herein, a "new" power supply refers to a power supply that was not previously coupled to the computing device. For instance, the controller 307 may detect that new power supply 304-1 is coupled to the dual rail circuitry 303. In response to coupling of both the power supply (e.g., 304-2) and the new power supply (e.g., 304-1), the controller 307 may identify the power supply or the new power supply as an efficient power path for the dual rail circuitry 303. As used herein, an "efficient power path" may refer to a power path that results in a lowest voltage drop across the dual rail circuitry 303. That is, a controller 307 may determine which of a plurality of power paths is a more efficient power path for the dual rail circuitry 303, based on dissipation of power, power loss, and/or a voltage drop across the power path.

As discussed herein, the circuit 300 may be configured such that the dual rail circuitry 303 is powered using the efficient power path. For instance, the controller 307 may individually actuate the first FETs pair 301 and the second FET pair 305 coupled to the dual rail circuitry 303. That is, the controller 307 may instruct a proximal FET on each of the first FET pair and the second FET pair, such as FET 302-2 and 302-3, to be in an off position. Similarly, the controller 307 may instruct a distal FET on each of the first FET pair and the second FET pair, such as 302-1 and 302-4, to be in an on position.

To further illustrate, the first FET pair 301 may be coupled to the power supply 304-1 and the second FET pair 305 may be coupled to the new power supply 304-2. Powering the dual rail circuitry using the efficient power path by individually actuating the first FET pair 301 and the second FET pair 305 may include substantially simultaneously turn off, using the controller 307, a proximal FET 302-2 on the first FET pair 301 and turning on a distal FET 302-4 on the second FET pair 305. Further, the controller may substantially simultaneously turning off a distal FET 302-1 on the first FET pair and turn on a proximal FET 302-3 on the second FET pair.

In the foregoing detailed description of the present disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure.

The figures herein follow a numbering convention in which the first digit corresponds to the drawing figure number and the remaining digits identify an element or component in the drawing. Elements shown in the various figures herein can be added, exchanged, and/or eliminated so as to provide a number of additional examples of the present disclosure. In addition, the proportion and the relative scale of the elements provided in the figures are intended to illustrate the examples of the present disclosure, and should not be taken in a limiting sense. As used herein, "a number of" an element and/or feature can refer to one or more of such elements and/or features.

What is claimed:

1. A circuit comprising:
a first field-effect transistor (FET) pair directly coupled to a dual rail circuitry;
a second FET pair coupled directly to the dual rail circuitry; and
a controller coupled to the first FET pair and the second FET pair, the controller to:
switch a first power supply to the dual rail circuitry using the first FET pair based on a determination that the first power supply of a first power supply circuitry reduces voltage drop across the dual rail circuitry, wherein the dual rail circuitry is to provide the first power supply to a computing device from the first power supply circuitry coupled to the first FET pair; and
switch a second power supply to the dual rail circuitry using the second FET pair based on a determination that the second power supply from a second power supply circuitry reduces the voltage drop across the dual rail circuitry, wherein the dual rail circuitry is to provide the second power supply to the computing device from the second power supply circuitry coupled to the second FET pair.

2. The circuit of claim 1, wherein the first FET pair and the second FET pair form a diode OR dual rail circuitry.

3. The circuit of claim 1, wherein:
the first FET pair includes a first FET and a second FET; and
the second FET pair includes a third FET and a fourth FET;
wherein the second FET and the third FET are proximal to an output of the dual rail circuitry, relative to the first FET and the fourth FET.

4. The circuit of claim 1, wherein the controller is to maintain a current to the dual rail circuitry during the switch of the first power supply.

5. The circuit of claim 1, wherein the controller is to:
detect the first power supply circuitry and the second power supply circuitry are coupled to the dual rail circuitry; and identify whether the first power supply circuitry or the second power supply circuitry minimizes a voltage drop across the dual rail circuitry;
wherein the controller is to switch the first power supply based on the identification of the first power supply circuitry or the second power supply circuitry that minimizes the voltage drop.

6. A non-transitory computer-readable storage medium containing instructions that when executed cause a processor of a computing device to:
detect connection of a second power supply to second power supply circuitry;
transmit a first signal directly to a field effect transistor (FET) pair of a first power supply circuitry coupled to a first power supply, wherein the first power supply circuitry and the second power supply circuitry form a dual rail circuitry;
transmit a second signal directly to a FET pair of the second power supply circuitry; and
coordinate switching power supplied to the dual rail circuitry from the first power supply to the second power supply, in response to the transmission of the first signal and the second signal and a voltage drop across the dual rail circuitry, wherein the dual rail circuitry is to provide the second power supply to a computing device.

7. The non-transitory computer-readable storage medium of claim 6, including instructions that when executed cause the processor to:
identify if the first power supply or the second power supply results in a lower amount of power loss by the dual rail circuitry.

8. The non-transitory computer-readable storage medium of claim 6, wherein the instructions to transmit the first signal to the FET pair of the first power supply circuitry include instructions to:
turn off a FET on the FET pair of the first power supply circuitry in response to receipt of the first signal.

9. The non-transitory computer-readable storage medium of claim 6, wherein the instructions to transmit the second signal to the FET pair of the second power supply circuitry include instructions to:
turn on a FET on the FET pair of the second power supply circuitry in response to receipt of the second signal.

10. The non-transitory computer-readable storage medium of claim 6, wherein the instructions to coordinate switching power supplied to the dual rail circuitry include instructions to:
turn on a FET on the FET pair of the second power supply circuitry, and turn off a FET on the FET pair of the first power supply circuitry substantially simultaneously.

11. A circuit comprising:
a first field effect transistors (FETs) pair and a second FET pair coupled to a dual rail circuitry; and
a controller coupled to the dual rail circuitry, the controller to:
detect that a first power supply is directly coupled to the dual rail circuitry;
detect that a second power supply is directly coupled to the dual rail circuitry;
switch power supplied to the dual rail circuitry from the first power supply to the second power supply in response to a voltage drop across the dual rail circuitry; and
individually actuate the first FET pair and the second FET pair to power the dual rail circuitry using the second power path, wherein the dual rail circuitry is to provide the second power supply to a computing device.

12. The circuit of claim 11, the controller to:
instruct a proximal FET on each of the first FET pair and the second FET pair to be in an off position; and
instruct a distal FET on each of the first FET pair and the second FET pair to be in an on position.

13. The circuit of claim 11, wherein the first FET pair is coupled to the first power supply and the second FET pair is coupled to the new second power supply.

14. The circuit of claim 13, the controller to:
substantially simultaneously turn off a proximal FET on the first FET pair and turn on a distal FET on the second FET pair.

15. The circuit of claim 13, the controller to:
substantially simultaneously turn off a distal FET on the first FET pair and turn on a proximal FET on the second FET pair.

* * * * *